(12) United States Patent
Lee et al.

(10) Patent No.: US 8,411,002 B2
(45) Date of Patent: Apr. 2, 2013

(54) PRINTED CIRCUIT BOARD AND DISPLAY SYSTEM INCLUDING THE PRINTED CIRCUIT BOARD

(75) Inventors: Bum Lee, Chunan-si (KR); Sung-Min Jang, Seoul (KR); Tae-Hoon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 1074 days.

(21) Appl. No.: 12/391,767

(22) Filed: Feb. 24, 2009

(65) Prior Publication Data

US 2009/0219239 A1 Sep. 3, 2009

(30) Foreign Application Priority Data

Feb. 28, 2008 (KR) ........................ 10-2008-0018399

(51) Int. Cl.
*G09G 3/36* (2006.01)
(52) U.S. Cl. ............ 345/87; 345/905; 349/58; 349/149; 349/150
(58) Field of Classification Search ............... 349/150, 349/58; 343/841
See application file for complete search history.

(56) References Cited

U.S. PATENT DOCUMENTS

| | | | |
|---|---|---|---|
| 6,924,855 B2 * | 8/2005 | Chung | 349/58 |
| 2007/0115419 A1 * | 5/2007 | Song | 349/150 |
| 2008/0309575 A1 * | 12/2008 | Gansen | 343/841 |

FOREIGN PATENT DOCUMENTS

JP 11284291 A * 10/1999

* cited by examiner

*Primary Examiner* — Quan-Zhen Wang
*Assistant Examiner* — Troy Dalrymple
(74) *Attorney, Agent, or Firm* — Cantor Colburn LLP (57) ABSTRACT

A display system includes a system module, a connector connected to the system module, and a display module connected to the system module through the connector. The display module includes a liquid crystal panel which displays an image, and a first printed circuit board ("PCB") which drives the liquid crystal panel. The first PCB includes a ground layer having a first ground region electrically connected to the display module, and a second ground region electrically isolated from the first ground region and electrically connected to the connector. The system module is configured to transmit communication signals to the display module and/or receive communication signals from the display module. The system module is further configured to transmit a noise component, which is independent of the communication signals, to the display module through the connector.

17 Claims, 11 Drawing Sheets

PRINTED CIRCUIT BOARD AND DISPLAY SYSTEM INCLUDING THE PRINTED CIRCUIT BOARD

This application claims priority to Korean Patent Application No. 10-2008-0018399, filed on Feb. 28, 2008, and all the benefits accruing therefrom under 35 U.S.C. §119, the contents of which in its entirety are herein incorporated by reference.

BACKGROUND OF THE INVENTION

1. Field of the Invention

The present invention relates to a printed circuit board ("PCB") and a display system including the PCB, and more particularly, to a PCB having an improved wireless reception rate, and a display system including the same.

2. Description of the Related Art

A display system typically includes a system module and a display module. The system module includes elements for driving the display system, such as a central processing unit ("CPU") and a memory, for example, while the display module generally includes, among other components, a liquid crystal panel which displays images. When a user inputs a command to the display system, the system module processes the command, and thereby controls the display module to display information based on the command input by the user.

As use of portable communication devices which communicate through a wireless communication network, such as a wireless local area network ("WLAN") or a wireless wide area network ("WWAN"), for example, increases, wireless reception has become an important factor in measuring performance of display systems which utilize the portable communication devices. Examples of these portable communication devices include laptop computers and personal digital assistants ("PDAs").

The system module and the display module of a display system are driven independently by their respective driving circuits. Therefore, it is necessary to ensure compatibility between the system module and the display module of a display system, e.g., by enabling the system module and the display module to communicate with each other using a predefined communication method, for example.

However, during communication between the system module and the display module, high-frequency components are generated due to noise components generated, for example, by the system module harmonizing with high-frequency noise components of the display module. Such high-frequency components generate electromagnetic waves, thereby adversely affecting, e.g., lowering, a wireless reception rate of the display system.

BRIEF SUMMARY OF THE INVENTION

Exemplary embodiments of the present invention provide a printed circuit board ("PCB") which have improved wireless reception rate.

Exemplary embodiments of the present invention also provide a display system including the PCB which has improved wireless reception rate.

However, alternative exemplary embodiments of the present invention are not restricted to as set forth herein. Further, the above and other aspects of the present invention will become more readily apparent to one having ordinary skill in the art by referencing a more detailed description of exemplary embodiments of the present invention described below and with reference to the accompanying drawings.

According to an exemplary embodiment of the present invention, a display system includes a system module, a connector connected to the system module, and a display module connected to the system module through the connector. The display module includes a liquid crystal panel which displays an image, and a first PCB which drives the liquid crystal panel. The first PCB includes a ground layer. The ground layer includes a first ground region electrically connected to the display module and a second ground region electrically isolated from the first ground region and electrically connected to the connector. The system module is configured to transmit communication signals to the display module and/or receive communication signals from the display module. The system module is further configured to transmit a noise component, which is independent of the communication signals, to the display module through the connector.

According to another aspect of the present invention, a PCB includes a ground layer and a surface layer. The ground layer includes a first ground region and a second ground region electrically isolated from the first ground region, and the surface layer includes a first ground terminal electrically connected to the first ground region and a second ground terminal electrically connected to the second ground region. The surface layer is connected to a connector through which communication signals and a noise component are transmitted. The communication signals are independent of the noise component, and the noise component is transmitted to the second ground region through the second ground terminal.

According to yet another alternative exemplary embodiment of the present invention, a method for electrically grounding a display system is provided. The display system includes a system module, a display module having a liquid crystal panel and a first printed circuit board, and a connector disposed between the system module and the display module. The method includes: electrically connecting the display module to the system module through the connector; driving the liquid crystal panel using the first printed circuit board, the first printed circuit board comprising a ground layer including a first ground region and second ground region electrically isolated from the first ground region; electrically connecting the first ground region to the display module; electrically connecting the second ground region to the connector; at least one of transmitting communication signals to the display module and receiving communication signals from the display module; and transmitting a noise component which is independent of the communication signals to the display module through the connector.

BRIEF DESCRIPTION OF THE DRAWINGS

The above and other aspects, features and advantages of the present invention will become more readily apparent by describing in further detail exemplary embodiments thereof with reference to the accompanying drawings, in which:

FIGS. 10A and 11A are graphs of frequency versus signal strength which illustrate performance characteristics of a display system of the prior art.

DETAILED DESCRIPTION OF THE INVENTION

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

A printed circuit board ("PCB") and a display system including the PCB, according to exemplary embodiments of the present invention, will now be described in further detail with reference to FIGS. 1 through 11B.

Figure 1:
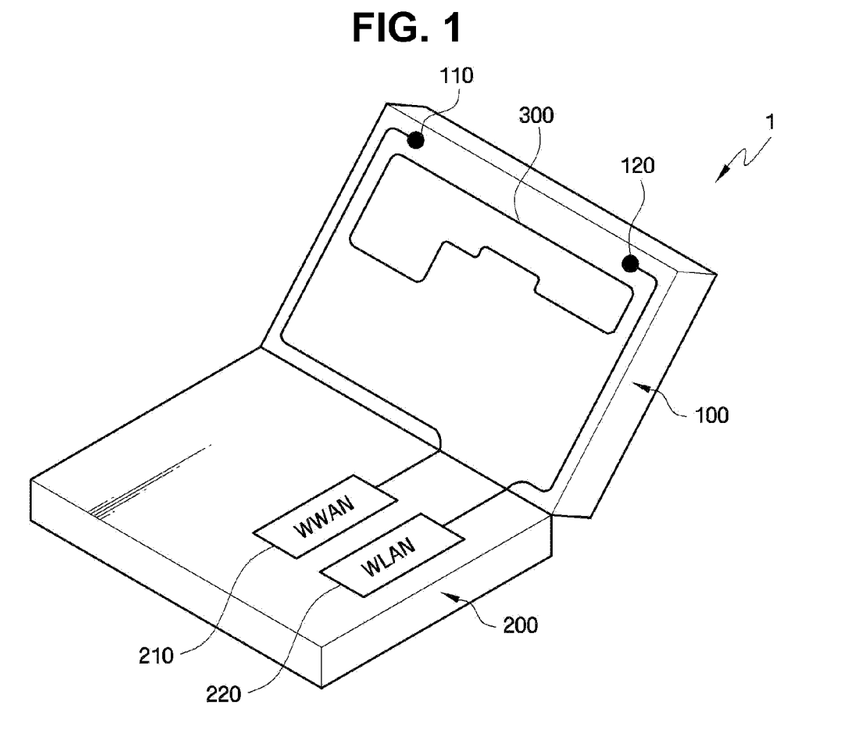
FIG. 1 is a front perspective view of a display system according to an exemplary embodiment of the present invention.
Figure 2:
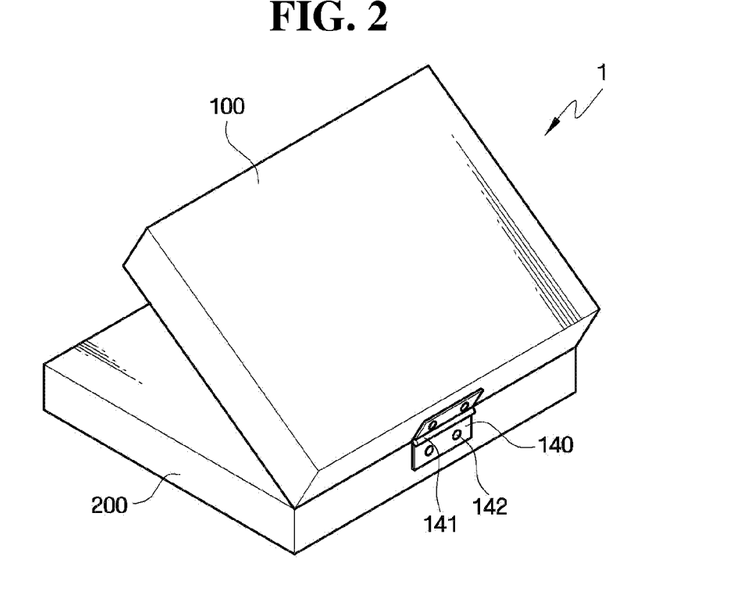
FIG. 2 is a rear perspective view of the display system according to the exemplary embodiment of the present invention shown in FIG. 1.

FIG. 1 is a front perspective view of a display system 1 according to an exemplary embodiment of the present invention, and FIG. 2 is a rear perspective view of the display system 1 according to an exemplary embodiment of the present invention.

Referring to FIG. 1, the display system 1 according to an exemplary embodiment includes a display module 100 and a system module 200, which drives the display system 1. The display module 100 may include a liquid crystal panel (not shown) and a first PCB 300, which drives the liquid crystal panel. In an exemplary embodiment of the present invention, the display module 100 and the system module 200 communicate with each other using wires (not shown) through a connector (not shown), for example, as will be described later in further detail with reference to FIG. 6.

The display system 1 performs wireless communication utilizing, for example, a wireless wide area network ("WWAN") or a wireless local area network ("WLAN"). The WWAN is a data communication network which covers a wide area (relative to a coverage area of the WLAN). More specifically, a communication range for WWANs is normally measured in miles, whereas the WLAN is a short-range communication network which provides high-speed Internet services for a wireless connection device within a smaller communication range than the communication range of the WWAN. Portable communication devices such as laptop computers or personal digital assistants ("PDAs"), for example, may use a WWAN and/or a WLAN.

Still referring to FIG. 1, the display system 1 further includes a first wireless communication antenna 110 and a second wireless communication antenna 120, along with a corresponding first wireless communication card 210 and a second wireless communication card 220 to perform wireless communication. Specifically, the display module 100 may include the first wireless communication antenna 110 and the second wireless communication antenna 120, while the system module 200 may include the first wireless communication card 210 and the second wireless communication card 220. In an exemplary embodiment of the present invention, the first wireless communication card 210 is a WWAN card 210, while the second wireless communication card 220 is a WLAN card 220.

The first wireless communication antenna 110 and the second wireless communication antenna 120 receive wireless signals from outside the display system 1. Further, the first wireless communication antenna 110 and the second wireless communication antenna 120 may be disposed at an upper portion of the display module 100, as shown in FIG. 1. In this case, the first wireless communication antenna 110 and the second wireless communication antenna 120 easily receive the wireless signals from outside the display system 1.

Performance of the first wireless communication antenna 110 and the second wireless communication antenna 120 may be adversely affected by the first PCB 300. Specifically, the first PCB 300 causes a deterioration of wireless reception capabilities of the first wireless communication antenna 110 and the second wireless communication antenna 120, particularly when the first wireless communication antenna 110 and/or the second wireless communication antenna 120 are disposed proximate the first PCB 300.

For example, when the display system 1 communicates with a WWAN, high-frequency signals present in, e.g., generated by, the first PCB 300 generate electromagnetic waves, and the electromagnetic waves lower a wireless reception rate of the WWAN antenna 110, as will be described in further detail below with reference to the first PCB 300 according to an exemplary embodiment of the present invention.

When the display system 1 is a portable communication device such as a laptop computer, for example, the display system 1 may include the WWAN card 210 and/or the WLAN card 220. The WWAN card 210 and/or the WLAN card 220 process wireless signals received by the WWAN antenna 110 and/or the WLAN antenna 120, respectively, and may thereafter provide the processed wireless signals to an additional PCB (not shown) of the system module 200, as will be described in further detail below with reference to FIG. 4.

Referring now to FIG. 2, the display module 100 and the system module 200 according to an exemplary embodiment of the present invention are connected to each other by a conductive connector 140. Specifically, when the display system 1 is a portable communication device such as a laptop computer, for example, the conductive connector 140 is a hinge-type connector which mechanically and electrically connects the display module 100 to the system module 200 so that the display system 1 can be opened and closed. The conductive connector 140 is illustrated in FIG. 2 as being exposed to outside the display system 1. In an alternative exemplary embodiment, the conductive connector 140 may be disposed inside the display system 1, instead of being disposed on an exterior portion thereof (as shown in FIG. 2).

The conductive connector 140 is formed of a conductive material. The conductive connector 140 may include a hinge 141 and fasteners 142, also formed of a conductive material. The conductive connector 140 will be described in further detail below with reference to FIG. 4.

Figure 3:
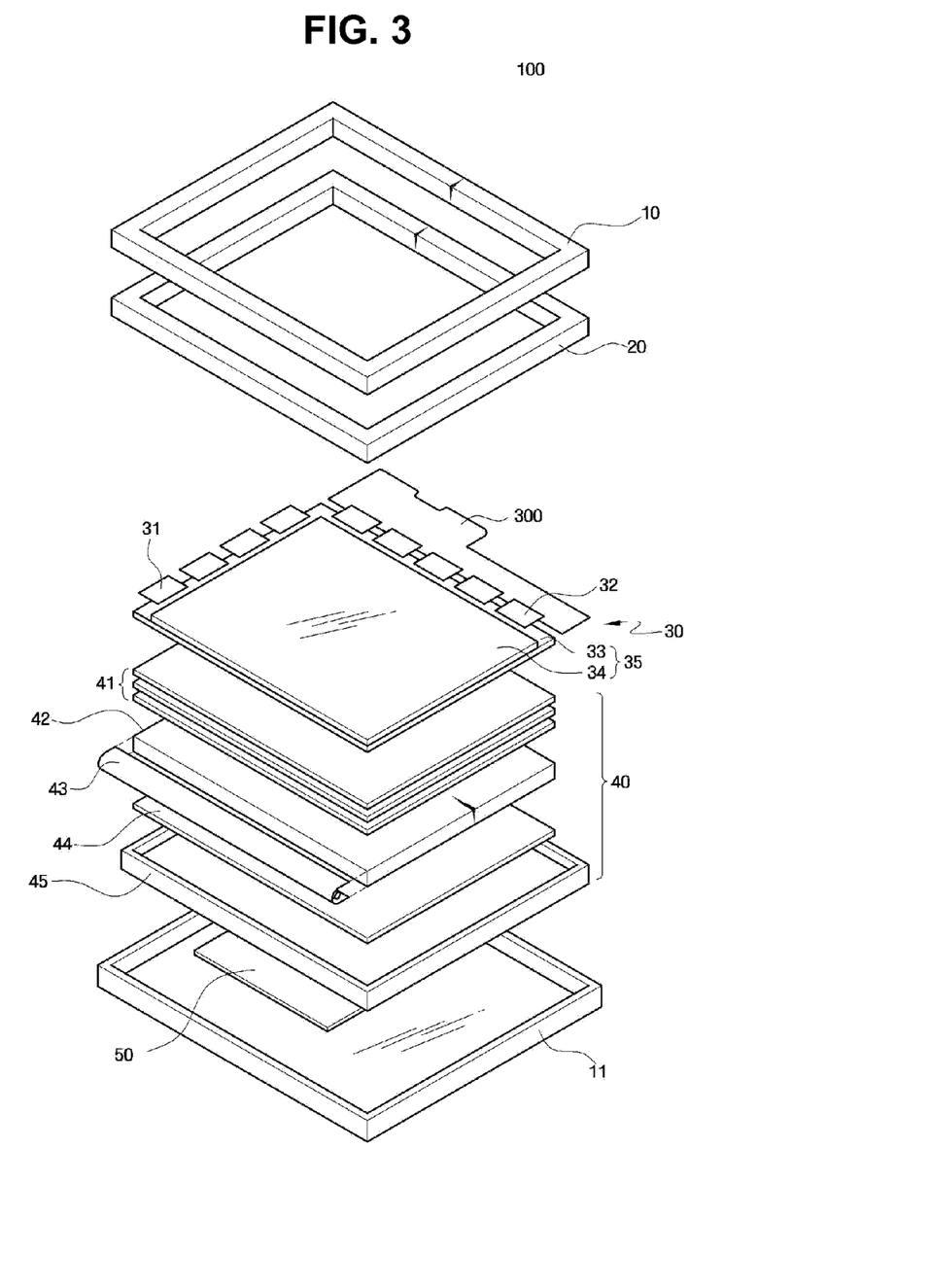
FIG. 3 is an exploded perspective view of a display module of the display system according to the exemplary embodiment of the present invention shown in FIG. 1.

FIG. 3 is an exploded perspective view of the display module 100 of the display system 1 according to the exemplary embodiment of the present invention shown in FIG. 1. Referring now to FIG. 3, the display module 100 according to an exemplary embodiment includes a display unit 30, a backlight unit 40, a chassis 20 such as an upper chassis 20 or, alternatively, a top chassis 20, a top cover 10 and a bottom cover 11.

The display unit 30 includes a liquid crystal panel 35, a plurality of gate tape carrier packages ("TCPs") 31, a plurality of data TCPs 32 and the first PCB 300. The liquid crystal panel 35 includes a first substrate 33, a second substrate 34 disposed opposite to, e.g., substantially facing, the first substrate 33, and a liquid crystal layer (not shown) interposed between the first substrate 33 and the second substrate 34.

The first substrate 33 according to an exemplary embodiment of the present invention is a thin-film transistor ("TFT") substrate on which a plurality of switching devices, e.g. a plurality of TFTs, are arranged in a substantially matrix pattern. Data lines of a plurality of data lines (not shown) are connected to source terminals of each TFT of the plurality of TFTs, and gate lines of a plurality of gate lines (not shown) are connected to gate terminals of each of the TFTs.

The second substrate 34 according to an exemplary embodiment is a color filter substrate on which an array including a plurality of red, green and blue pixels (not shown) is formed. A plurality of common electrodes (not shown) formed of a transparent conductive material, for example, may further be disposed on the second substrate 34.

The liquid crystal layer (not shown) is interposed between the first substrate 33 and the second substrate 34. An alignment of liquid crystal molecules in the liquid crystal layer varies according to an electric field generated between the first substrate 33 and the second substrate 34.

Gate TCPs 31 of the plurality of gate TCPs 31 may be connected to the gate lines, and data TCPs 32 of the plurality of data TCPs 32 may be connected to the data lines. Additional driving elements for processing a gate driving signal and a data driving signal, for example, may be mounted on the first PCB 300. As a result, a gate signal and an image data voltage are generated by the gate TCPs 31, the data TCPs 32 and the additional driving elements of the first PCB 300. More specifically, the gate signal is provided to each of the gate lines, and the image data voltage is provided to each of the data lines.

Still referring to FIG. 3, the backlight unit 40 according to an exemplary embodiment includes: a light source unit 43 which emits light to provide the light to the liquid crystal panel 35; a waveguide plate 42 which guides the light emitted from the light source unit 43; optical sheets 41 disposed above the waveguide plate 42; a reflective sheet 44 disposed below the waveguide plate 42; a mold frame 45; and a second PCB 50 which drives the light source unit 43.

The light source unit 43 includes light sources (not shown) which generate light, and a light source cover (not shown) which, among other things, protects the light sources. The light sources may be, for example, cold cathode fluorescent lamps ("CCFLs"), formed as thin cylinders, or, alternatively, may be external electrode fluorescent lamps ("EEFLs") having exposed electrodes. In an exemplary embodiment, the light source cover substantially surrounds, and thus protects, the light sources. In addition, the light cover may reflect the light emitted from the light sources toward the waveguide plate 42 to thereby substantially improve an efficiency of use of light.

The waveguide plate 42 guides light emitted from the light source unit 43 to the display unit 30. The waveguide plate 42 may have a uniform thickness. Alternatively, the waveguide plate 42 may be formed as a wedge so that the thickness of the waveguide plate 42 can become smaller more distant from the light source unit 43.

The optical sheets 41 are disposed above the waveguide plate 42 to effectively improve a luminance of light emitted therefrom and/or to enhance an appearance of light emitted from the backlight unit 40. Specifically, the optical sheets 41 diffuse and/or collect light emitted from the waveguide plate 42. In an exemplary embodiment of the present invention, the optical sheets 41 include a diffusive sheet (not shown), a prism sheet (not shown) and a protective sheet (not shown).

The diffusive sheet has a substantially hazy, e.g., diffusive, transmittance property, and thus enhances an appearance of light emitted from the backlight unit 40 by effectively eliminating problems such as bright lines, dark lines and dark corner areas, for example in a display area of the display unit 30. The prism sheet includes a plurality of prism patterns formed thereon. The prism sheet collects light emitted from the waveguide plate 42. The protective sheet is disposed on the prism sheet and protects the prism sheet. In addition, the protective sheet prevents any underlying sheets (not shown) from directly contacting the display unit 30 and thus improves a reliability and a quality of images displayed by the display module 100.

The reflective sheet 44 reflects light which leaks from a lower portion of the waveguide plate 42 back toward the waveguide plate 42. The reflective sheet 44 according to an exemplary embodiment includes a material having high optical reflectance.

The mold frame 45 contains and fixes the backlight unit 40 therein.

An inverter (not shown) for applying power to the light source unit 43 may be disposed on the second PCB 50 for driving the light source unit 43. Thus, the light source unit 43 and the inverter are electrically connected using wires, for example.

When power is applied to the gate terminals of the TFTs, an electric field based on a voltage difference between the pixel electrodes and the common electrodes is generated between the pixel electrodes and the common electrodes. As a result, an alignment of liquid crystal molecules in the liquid crystal layer is controlled, an optical transmittance of the liquid crystal layer is thereby varied, and thus, an amount of light provided from the backlight unit 40 and thereafter through the display unit 30 is controlled to display an image on the display unit 30 of the display module 100. In this manner, an image having any desired grayscale level may be displayed.

Still referring to FIG. 3, the top chassis 20 according to an exemplary embodiment of the present invention is formed of a conductive material such as a metal, for example. The top chassis 20 is electrically connected to a first ground terminal (not shown; described in further detail below with reference to FIG. 5) of the first PCB 300 and/or a second ground terminal (FIG. 5) of the first PCB 300. In an alternative exemplary embodiment of the present invention, the top chassis 20 is electrically connected to yet another ground terminal (not shown) of the second PCB 50. Thus, the top chassis 20 serves as an electric ground surface, to thereby substantially strengthen an electrical grounding of the first PCB 300 and/or of the second PCB 50. As a result, the top chassis 20 strengthens a ground of the display system 1, as will be described in further detail below.

The bottom cover 11 may be formed in a substantially box shape, e.g., a substantially rectangular shape, having an open upper surface, e.g., an open top, as shown in FIG. 3. In addition, the bottom cover 11 may be disposed at the bottom of the display module 100.

The top cover 10 according to an exemplary embodiment may be formed as a substantially rectangular-shaped frame. Further, the top cover 10 may be disposed at an upper portion, e.g. a top portion, of the display module 100. Thus, the top cover 10 contains the display unit 30 therein. Additionally, the top cover 10 is connected to the bottom cover 11 and thus securely contains the display unit 300 therein, to effectively prevent the display unit 30 from being detached therefrom.

Figure 4:
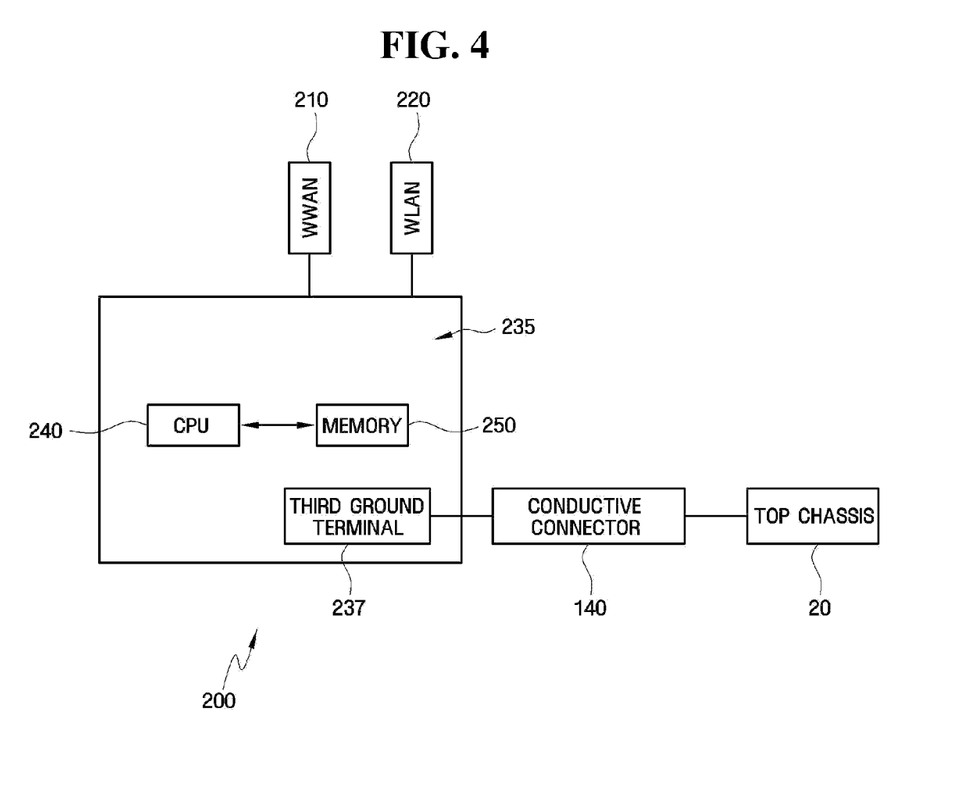
FIG. 4 is a block diagram of a system module of the display system according to the exemplary embodiment of the present invention shown in FIG. 1.

FIG. 4 is a block diagram of the system module 200 of the display system according to the exemplary embodiment of the present invention shown in FIG. 1. Referring to FIG. 4, the system module 200 according to an exemplary embodiment includes a third PCB 235, on which a central processing unit ("CPU") 240 and a memory 250 are mounted. The CPU 240 and the memory 250 are well-known to one of ordinary skill in the art to which the present invention pertains, and thus, further detailed description thereof has been omitted. The third PCB 235 may receive wireless signals from the WWAN card 210 and/or the WLAN card 220.

Further, the third PCB 235 may include a third ground terminal 237 which connects to an electric ground. More specifically, the third ground terminal 237 is electrically connected to the top chassis 20 via the conductive connector 140. In addition, referring again to FIG. 2, the hinge 142 of the conductive connector 140 may be electrically connected, for example, to the top chassis 20 of the display module 100 and the third ground terminal 237 of the third PCB 235 of the system module 200. As a result, the third ground terminal 237 is electrically connected to the top chassis 20.

Since the top chassis 20 serves as an electric ground surface which effectively strengthens a ground thereof, the top chassis 20 substantially reduces noise present in the third ground terminal 237 of the third PCB 235. As a result, a wireless reception rate of the first wireless communication antenna 110 and the second wireless communication antenna 120 is effectively prevented from being degraded by electromagnetic waves generated, for example, by the noise.

Figure 5:
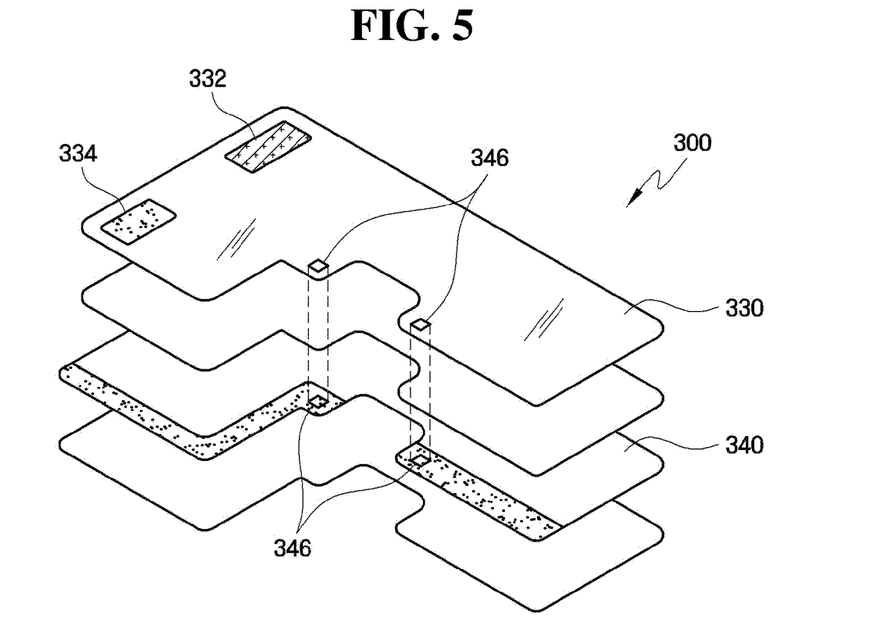
FIG. 5 is an exploded perspective view of a first printed circuit board ("PCB") of the display system according to the exemplary embodiment of the present invention shown in shown in FIG. 1.
Figure 6:
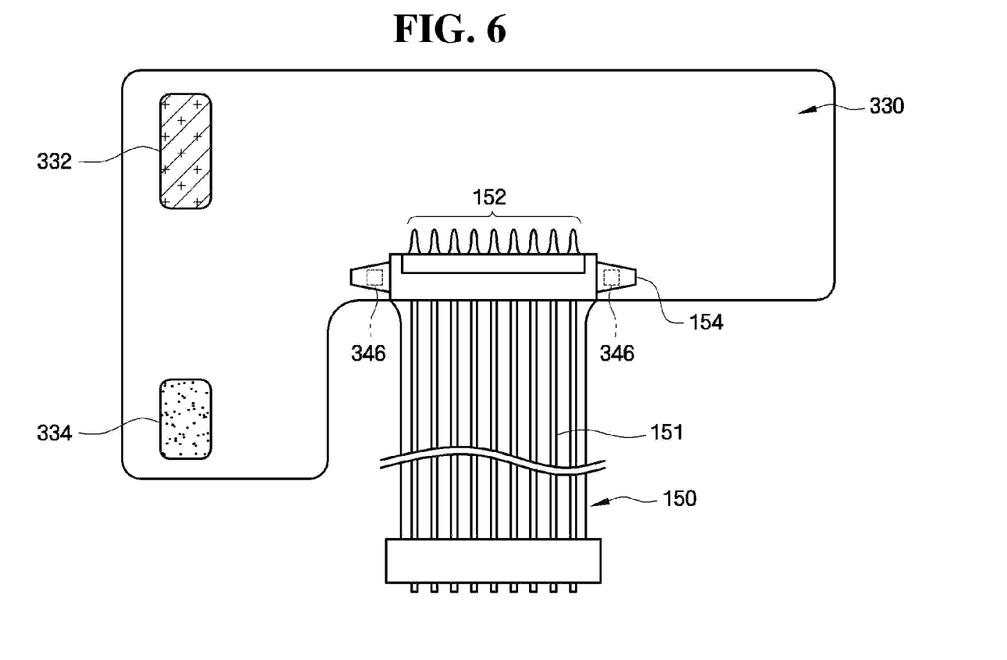
FIG. 6 is a plan view of a connector connected to a surface layer of the first PCB of the display system according to the exemplary embodiment of the present invention shown in FIG. 5.
Figure 7:
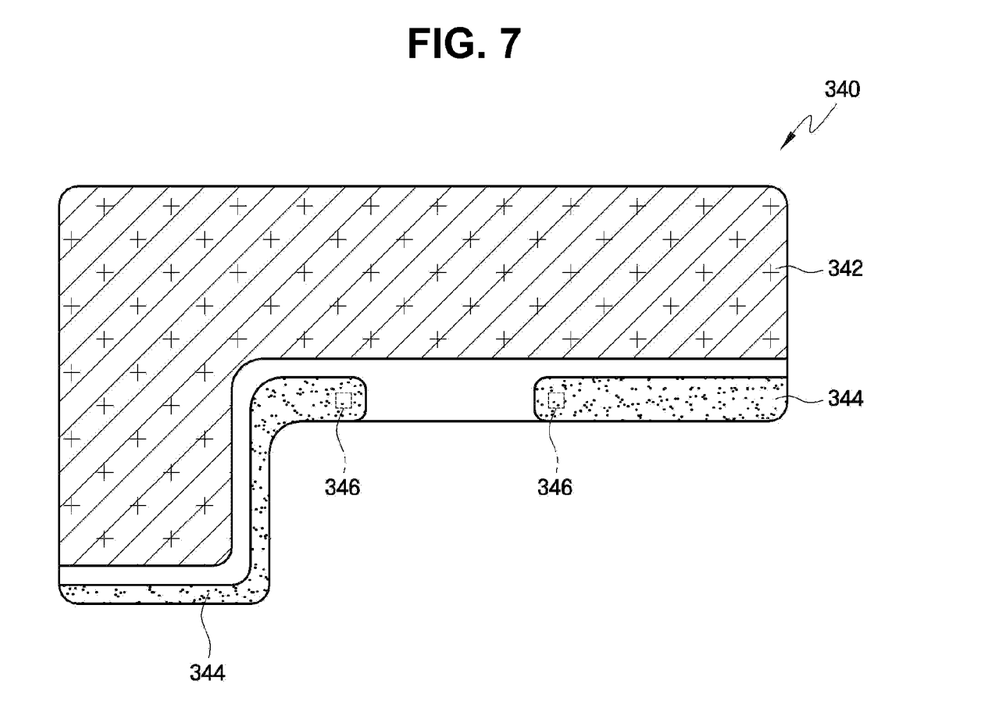
FIG. 7 is a plan view of a ground layer of the first PCB of the display system according to the exemplary embodiment of the present invention shown in FIG. 5.

FIG. 5 is an exploded perspective view of the first PCB 300 according to an exemplary embodiment of the present invention, FIG. 6 is a plan view which illustrates a connector 150 connected to a surface layer 330 of the first PCB 300, and FIG. 7 is a plan view of a ground layer 340 of the first PCB 300 according to an exemplary embodiment.

Referring now to FIGS. 5 through 7, the first PCB 300 has a multilayer structure including a plurality of layers. The layers of the first PCB 300 include, for example, the ground layer 340, which strengthens a ground connection of the first PCB 300, and the surface layer 330, which forms an upper surface, e.g., a top surface, of the first PCB 300.

The surface layer 330 may include a first ground terminal 332 and a second ground terminal 334. In an exemplary embodiment, the second ground terminal 334 contacts a noise terminal 154 of the connector 150.

The ground layer 340 includes a first ground region 342 and a second ground region 344, which is electrically isolated from the first ground region 342, as best shown in FIG. 7.

The first ground terminal 332 is electrically connected to the first ground region 342 through a first ground contact (not shown) connected to the first ground region 342. Similarly, the second ground terminal 334 is electrically connected to the second ground region 344 through a second ground contact 346 connected to the second ground region 344.

During operation of the display system 1, electric signals input to the first PCB 300 through the first ground terminal 332 include noise components. Specifically, the first PCB 300 according to an exemplary embodiment of the present invention includes a timing controller (not shown) which generates a clock signal, a level of which alternates, e.g., swings, between two or more levels. A swing signal, such as the clock signal, for example, however, causes noise in the electric signals input to the first PCB 300 through the first ground terminal 332. Further, the noise is transmitted to the first ground region 342 through the first ground terminal 332.

The surface layer 330 of the first PCB 300 is connected to the connector 150, through which the electric signals, e.g., communication signals, as well as noise is transmitted from an external device (not shown) to the first PCB 300. In an exemplary embodiment of the present invention, the external device may be the system module 200 (FIGS. 1 and 2), and more particularly, may be the third PCB 235 of the system module 200 (best shown in FIG. 4).

Thus, the surface layer 330 of the first PCB 300 is connected to the connector 150, through which noise components are transmitted from the system module 200 (e.g., the third PCB 235) to the first PCB 300. The noise components transmitted through the connector 150 may be, for example, noise components caused by swing signals generated by the CPU 240 and/or the memory 250 of the third PCB 235. Therefore, in an exemplary embodiment of the present invention, the noise components caused by the swing signals generated by the CPU 240 and/or the memory 250 are transmitted to the surface layer 330 of the first PCB 300 through the connector 150, as will be described in further detail below.

The system module 200 and the display module 100 (FIGS. 1-4) communicate with each other by transmitting and/or receiving standard communication signals to and/or from each other. In an exemplary embodiment, the standard communication signals include, for example, low-voltage differential signaling ("LVDS") signals, but alternative exemplary embodiments are not limited thereto. In an exemplary embodiment including the LVDS signals, the connector 150 is an input cable which transmits the LVDS signals between the system module 200 and the display module 100.

More specifically, LVDS is a type of data transmission method used to transmit digital signals from the system module 200 to the display module 100 at high speed. In an exemplary embodiment, the digital signals include information related to an image to be displayed by the display module 100. Further, the digital signals may be transmitted through copper wires using a voltage of approximately 3.3 V or, alternatively, a voltage of approximately 1.5 V, e.g., a voltage lower than a standard voltage of approximately 5 V as in a display module of the prior art. Further, LVDS enables the system module 200 and the display module 100 to effectively communicate with each other through a minimized number of communication lines 151 (FIG. 6) between the third PCB 235 (FIG. 4) and the first PCB 300 (FIGS. 3-5).

In an exemplary embodiment wherein the external device is the system module 200, as discussed above, the connector 150 is connected between the display module 100 and the system module 200. Thus, in addition to communication signals, noise components are also transmitted from the system module 200 to the display module 100 through the connector 150. In an exemplary embodiment, the communication signals and the noise components may be transmitted separately from each other between the system module 200 and the display module 100.

More specifically, the connector 150 according to an exemplary embodiment includes a plurality of the communication lines 151 through which communication signals are transmitted, a plurality of pins 152 formed at ends of the communication lines 151, and the noise terminal 154, which is electrically isolated from the communication lines 151 and pins 152 of the plurality of pins 152. Since the noise terminal 154 is electrically isolated from the communication lines 151 and the pins 152, the noise components are transmitted separately from the communication signals from the system module 200 to the display module 100 through the noise terminal 154.

Therefore, the noise components generated by the system module 200 are transmitted to the noise terminal 154. The noise terminal 154 contacts the second ground terminal 334 through the second ground contact 346 (FIG. 5). Thus, the noise terminal 154 electrically connects to the second ground region 344 through the second ground terminal 334. Therefore, the noise components are transmitted to the second ground terminal 334 through the noise terminal 154. Likewise, in an exemplary embodiment of the present invention wherein the external device is the third PCB 235, noise components generated by the third PCB 235 are transmitted to the second ground region 344 in a similar manner as described above.

Figure 8:
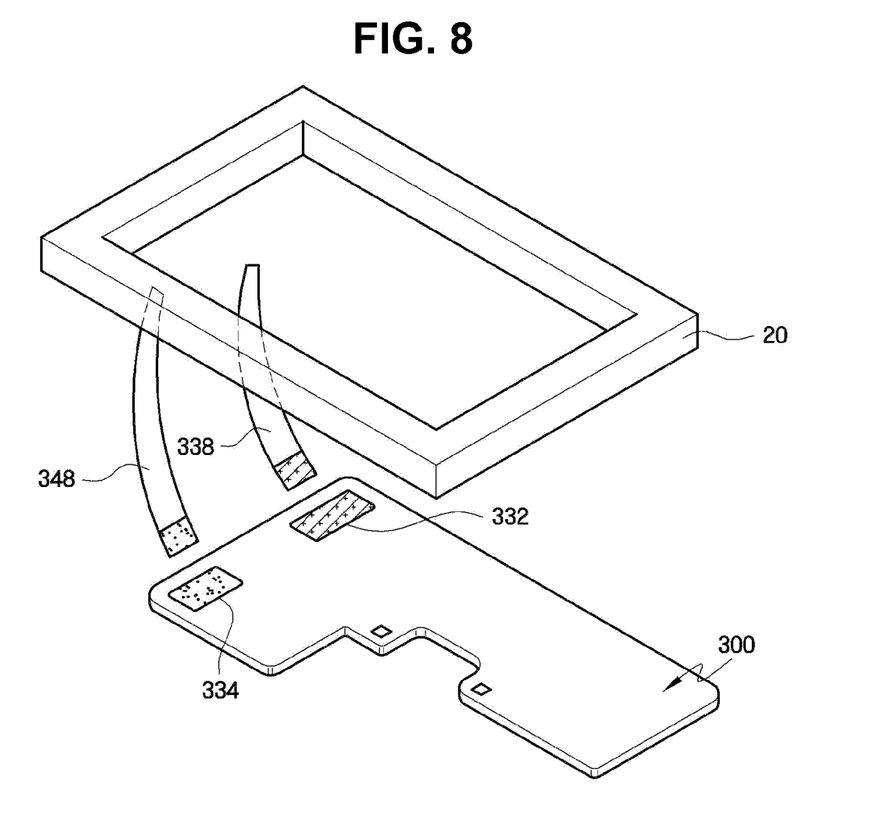
FIG. 8 is an exploded perspective view which illustrates how the first PCB is electrically connected to a top chassis of the display module of the display system according to the exemplary embodiment of the present invention shown in FIG. 3.
Figure 9:
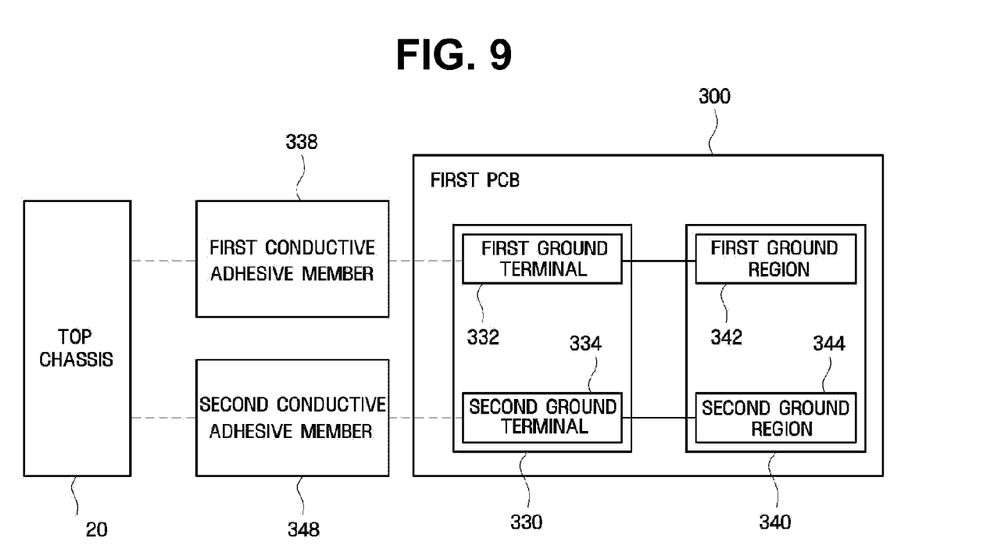
FIG. 9 is a block diagram which illustrates how the first PCB is electrically connected to the top chassis of the display module of the display system according to the exemplary embodiment of the present invention shown in FIG. 3.

FIG. 8 is an exploded perspective view which illustrates how the first PCB 300 is electrically connected to the top chassis 20 according to an exemplary embodiment of the present invention, and FIG. 9 is a block diagram which illustrates how the first PCB 300 is electrically connected to the top chassis 20.

Referring to FIGS. 8 and 9, the first ground terminal 332 and the second ground terminal 334 of the first PCB 300 are electrically connected to the top chassis 20. Specifically, the first ground terminals 332 is electrically connected to the top chassis 20 by a first conductive member 338, e.g., a first conductive adhesive member 338, and the second ground terminal 334 is electrically connected to the top chassis 20 by a second conductive member 348, e.g., a second conductive adhesive member 348. The first conductive adhesive member 338 and the second conductive adhesive member 348 may be aluminum adhesive tapes, but alternative exemplary embodiments are not limited thereto.

Thus, the first ground region 342 is electrically connected to the top chassis 20 through the first ground terminal 332, and the second ground region 344 is electrically connected to the top chassis 20 through the second ground terminal 334.

Specifically, in an exemplary embodiment, the first ground terminal 332 is electrically connected to the top chassis 20 through the first conductive adhesive member 338, and the second ground terminal 334 is electrically connected to the top chassis 20 through the second conductive adhesive member 348. Since the first ground region 342 is electrically connected to the first ground terminal 332, the first ground region 342 is also electrically connected to the top chassis 20.

Likewise, since the second ground region 344 is electrically connected to the second ground terminal 334, the second ground region 344 is electrically connected to the top chassis 20. The first conductive adhesive member 338 and the second conductive adhesive member 348 may be aluminum adhesive tapes, for example, but alternative exemplary embodiments are not limited thereto.

Thus, in the display system 1 according to an exemplary embodiment of the present invention, the first ground region 342 and the second ground region 344 are both be connected to the top chassis 20, thereby alleviating ripple components of a ground voltage of the first ground region 342 as well as ripple components of a ground voltage of the second ground region 344.

Therefore, noise components generated by the system module 200 may combine with noise components present in the display module 100 in the top chassis 20, rather than in the first PCB 300. Specifically, the noise components generated by the system module 200 are transmitted to the second ground region 344 through the connector 150. The noise components present in the display module 100 are transmitted to the first ground region 342 through the first ground terminal 332. Since the first ground region 342 and the second ground region 344 are electrically isolated from each other, the noise components generated by the system module 200 do not combine with the noise components present in the display module 100 in the first PCB 300.

Instead, the noise components generated by the system module 200 combine with the noise components present in the display module 100 in the top chassis 20, since the first ground region 342 and the second ground region 344 are both electrically connected to the top chassis 20. Put another way, the ground layer 340 of the first PCB 300 and the top chassis 20 strengthen a ground capability, and, more particularly, the top chassis 20 provides a ground which is better than a ground of the ground layer 340 of the first PCB 300. Thus, high-frequency components generated by noise components generated by the system module 200 are effectively prevented from harmonizing with the noise components present in the display module 100. Therefore, a wireless reception rate of the display system 1 is effectively prevented from being degraded, e.g., lowered, due to the high-frequency components. Thus, a wireless reception rate of the display system 1 according to an exemplary embodiment is substantially enhanced.

In addition, the wireless reception rate of the display system 1 is substantially enhanced without a need to modify an external appearance of the system module 200 and/or the display module 100.

Figure 10A:
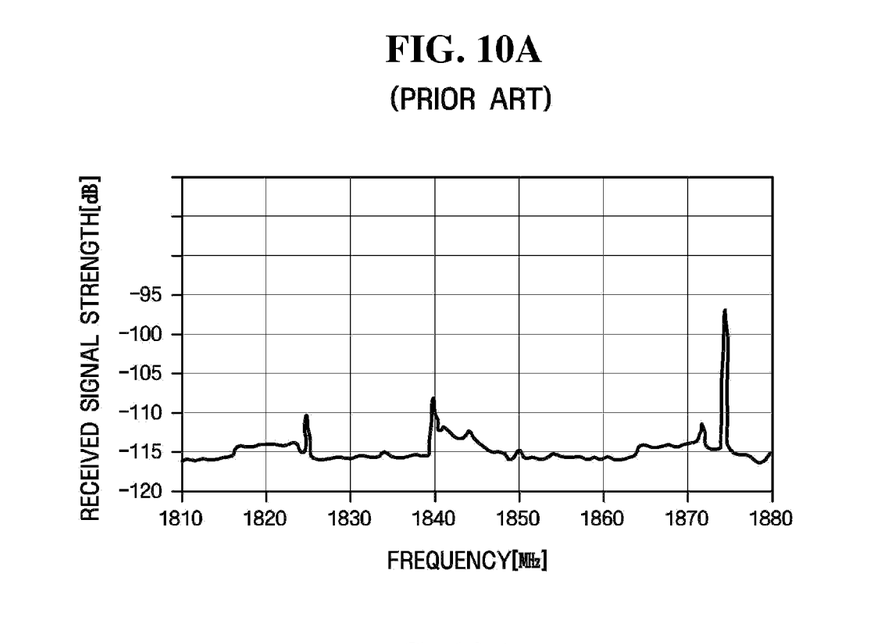
Figure 10B:
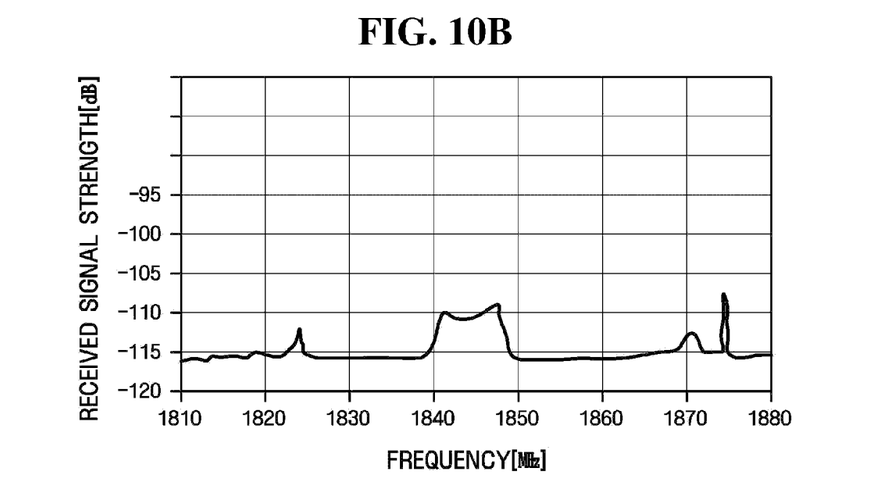
Figure 11A:
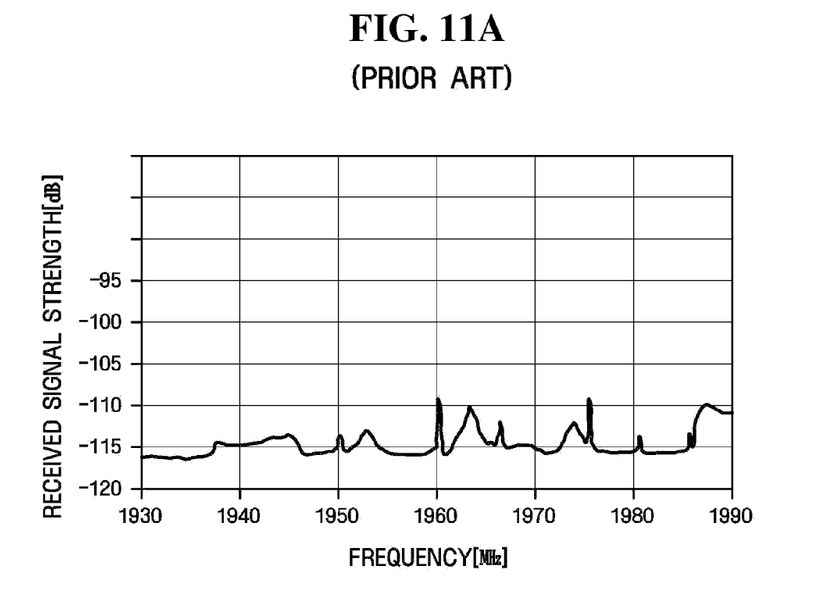
FIGS. 11A and 11B are graphs of frequency versus signal strength which illustrate performance characteristics of a display system according to an exemplary embodiment of the present invention.
Figure 11B:
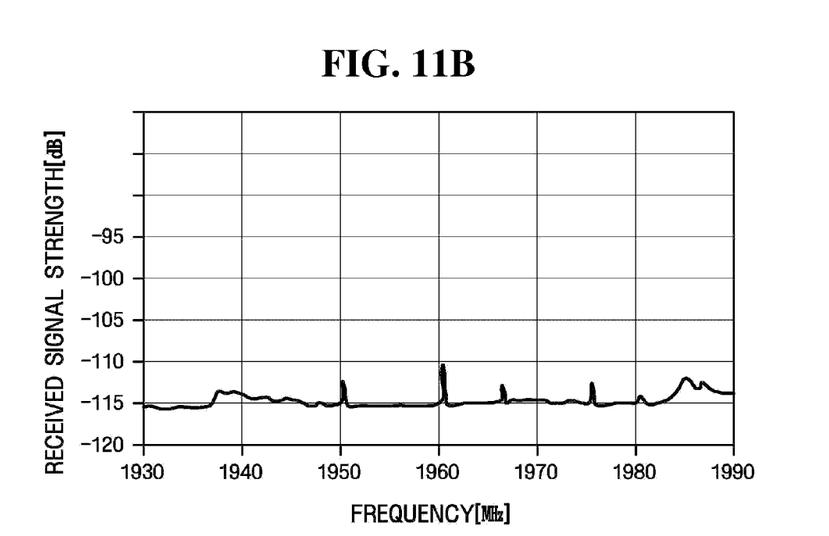

FIGS. 10A and 11A are graphs of frequency versus signal strength which illustrate performance characteristics of a display system of the prior art, while FIGS. 11A and 11B are graphs of frequency versus signal strength which illustrate performance characteristics of a display system according to an exemplary embodiment of the present invention. More specifically, FIGS. 10A through 11B are graphs of frequency versus signal strength which illustrate the display system according to an exemplary embodiment of the present invention having a substantially improved wireless reception rate in a Global System for Mobile communications ("GSM") network in comparison to the display system of the prior art used in a GSM network.

The GSM network is a European digital communication method which provides mobile communication services through a mobile phone, a facsimile device, or a laptop computer, for example, without using a modem. GSM networks are classified into a GSM network which uses dual frequency bands of 900 MHz and 1800 MHz, a GSM network which uses triple frequency bands of 900 MHz, 1800 MHz and 1900 MHz, and a GSM network which uses quadruple frequency bands of 850 MHz, 900 MHz, 1800 MHz and 1900 MHz. FIG. 10A illustrates a graph of received signal strength measurements obtained from a display system of the prior art when a frequency band of 1810-1880 MHz is used, and FIG. 10B illustrates a graph of received signal strength measurements obtained from a display system 1 according to an exemplary embodiment of the present invention when a frequency band of 1810-1880 MHz is used. FIG. 11A illustrates a graph of received signal strength measurements obtained from a display system of the prior art when a frequency band of 1930-1990 MHz is used, and FIG. 11B illustrates a graph of received signal strength measurements obtained from a display system 1 according to an exemplary embodiment of the present invention when a frequency band of 1930-1990 MHz is used.

Referring to FIGS. 10A through 11B, it can be seen that a received signal strength of the display system 1 according to an exemplary embodiment of the present invention is substantially improved in comparison with the display system of the prior art. Specifically, the received signal strength of the display system 1 according to an exemplary embodiment is approximately 5 dB higher than the received signal strength of the display system of the prior art. Further, the display system 1 according to an exemplary embodiment of the present invention generates substantially fewer high-frequency ripple components, than the display system of the prior art, as shown in FIGS. 10A through 11B.

Thus, a display system according to exemplary embodiments of the present invention as described herein has an advantage such as, but not being limited to, a substantially improved wireless reception capability.

The present invention should not be construed as being limited to the exemplary embodiments set forth herein. Rather, these exemplary embodiments are provided so that this disclosure will be thorough and complete and will fully convey the concept of the present invention to those skilled in the art.

For example, an alternative exemplary embodiment of the present invention provides a method for electrically grounding a display system, the display system including a system module, a display module having a liquid crystal panel and a first printed circuit board, and a connector disposed between the system module and the display module. The method includes: electrically connecting the display module to the system module through the connector; driving the liquid crystal panel using the first printed circuit board, the first printed circuit board comprising a ground layer including a first ground region and second ground region electrically isolated from the first ground region; electrically connecting the first ground region to the display module; electrically connecting the second ground region to the connector; transmitting communication signals to the display module and/or receiving communication signals from the display module; and transmitting a noise component, which is independent of the communication signals, to the display module through the connector.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display system comprising:
a system module;
a connector connected to the system module; and
a display module connected to the system module through the connector, the display module comprising:
a liquid crystal panel which displays an image; and
a first printed circuit board which drives the liquid crystal panel, the first printed circuit board comprising a ground layer comprising:
a first ground region electrically connected to the display module; and
a second ground region electrically isolated from the first ground region relative to the ground layer and electrically connected to the connector,
wherein the system module is configured to:
at least one of transmit communication signals to the display module and receive communication signals from the display module; and
transmit a noise component which is independent of the communication signals to the display module through the connector,
wherein the first ground region and the second ground region are both independently electrically connected to a top chassis of the display module.

2. The display system of claim 1, wherein the connector comprises a noise terminal electrically connected to the second ground region, wherein the noise component is transmitted from the system module to the display module through the noise terminal.

3. The display system of claim 2, wherein the first printed circuit board further comprises a surface layer, the surface layer comprising:
a first ground terminal electrically connected to the first ground region of the ground layer; and
a second ground terminal electrically connected to the noise terminal of the connector.

4. The display system of claim 3, wherein the display module further comprises the top chassis which stabilizes a ground and the first and second ground terminals are both electrically connected to the top chassis.

5. The display system of claim 4, wherein
the first ground terminal and the top chassis are electrically connected by a first conductive member, and
the second ground terminal and the chassis are electrically connected by a second conductive member.

6. The display system of claim 4, wherein the display module further comprises:
a light source unit which provides light to the liquid crystal panel; and
a second printed circuit board which drives the light source unit.

7. The display system of claim 6, wherein the system module comprises a third printed circuit board including a third ground terminal electrically connected to the top chassis.

8. The display system of claim 7, wherein the top chassis and the third ground terminal are electrically connected by a third conductive member which connects the display module to the system module.

9. The display system of claim 6, wherein the system module comprises a third printed circuit board electrically connected to the noise terminal of the connector, wherein the noise component is transmitted from the third printed circuit board to the noise terminal.

10. The display system of claim 1, wherein the display module further comprises a wireless communication antenna disposed proximate to the first printed circuit board and which receives a wireless signal from outside the display module.

11. The display system of claim 10, wherein the system module further comprises a wireless communication card which processes the wireless signal.

12. The display system of claim 11, wherein the wireless communication card comprises one of a wireless wide area network card and a wireless local area network card.

13. The display system of claim 1, wherein the connector comprises:
communication lines through which the communication signals are transmitted; and
pins formed at an end of each of the communication lines, wherein the noise terminal is electrically isolated from the communication lines and the pins.

14. A printed circuit board comprising:
a ground layer comprising:
a first ground region; and
a second ground region electrically isolated from the first ground region relative to the ground layer; and
a surface layer comprising:
a first ground terminal electrically connected to the first ground region; and
a second ground terminal electrically connected to the second ground region, wherein
the surface layer is connected to a connector through which communication signals and a noise component are transmitted,
the communication signals are independent of the noise components,
the noise component is transmitted to the second ground region through the second ground terminal, and
the first ground region and the second ground region are both independently electrically connected to a top chassis of a display module via the first ground terminal and the second ground terminal, respectively.

15. The printed circuit board of claim 14, wherein
the first ground terminal and the top chassis are electrically connected by a first conductive member, and
the second ground terminal and the top chassis are electrically connected by a second conductive member.

16. The printed circuit board of claim 14, wherein the connector comprises a noise terminal electrically connected to the second ground region, wherein the noise component is transmitted to the display module through the noise terminal.

17. The printed circuit board of claim 14, wherein the connector further comprises:
communication lines through which the communication signals are transmitted; and
pins formed at an end of each of the communication lines, wherein the noise terminal is electrically isolated from the communication lines and the pins.

* * * * *